(12) United States Patent
An et al.

(10) Patent No.: US 8,391,100 B2
(45) Date of Patent: Mar. 5, 2013

(54) SEMICONDUCTOR MEMORY APPARATUS

(75) Inventors: Sun Mo An, Icheon-si (KR); Sang Il Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 271 days.

(21) Appl. No.: 12/845,568

(22) Filed: Jul. 28, 2010

(65) Prior Publication Data

US 2011/0242929 A1 Oct. 6, 2011

(30) Foreign Application Priority Data

Mar. 30, 2010 (KR) .................. 10-2010-0028328

(51) Int. Cl.
*G11C 8/04* (2006.01)
(52) U.S. Cl. ........................ 365/236; 365/222
(58) Field of Classification Search .................. 365/222, 365/236

See application file for complete search history.

(56) References Cited

U.S. PATENT DOCUMENTS

| 6,906,976 | B2 | 6/2005 | Kwean |
| 7,042,774 | B2 | 5/2006 | Kim |
| 7,145,828 | B2 | 12/2006 | Lee et al. |
| 2002/0191467 | A1* | 12/2002 | Matsumoto et al. .......... 365/222 |
| 2004/0196719 | A1* | 10/2004 | Aritomi et al. ................ 365/222 |
| 2006/0018174 | A1 | 1/2006 | Park et al. |
| 2008/0181041 | A1* | 7/2008 | Koshita ........................ 365/222 |

FOREIGN PATENT DOCUMENTS

| JP | 2006-134559 | 5/2006 |
| KR | 100665854 B1 | 1/2007 |
| KR | 1020070109107 A | 11/2007 |

* cited by examiner

*Primary Examiner* — Michael Tran
(74) *Attorney, Agent, or Firm* — William Park & Associates Ltd.

(57) ABSTRACT

A semiconductor memory apparatus includes a counting control circuit and an address counting circuit. The counting control circuit is configured to generate a first counting start signal, a second counting start signal and a counting count signal in response to an auto-refresh signal, a voltage stabilization signal and a fuse control signal. The address counting circuit is configured to count a plurality of count addresses in response to the first counting start signal, and to count one or more specified count addresses from among the plurality of count addresses in response to the second counting start signal and the counting control signal.

19 Claims, 7 Drawing Sheets

120

SEMICONDUCTOR MEMORY APPARATUS

CROSS-REFERENCES TO RELATED APPLICATION

The present application claims priority under 35 U.S.C. §119(a) to Korean application number 10-2010-0028328, filed on Mar. 30, 2010, in the Korean Intellectual Property Office, which is incorporated herein by reference in its entirety.

BACKGROUND

1. Technical Field

The present invention relates to a semiconductor integrated circuit, and more particularly, to a semiconductor memory apparatus.

2. Related Art

In general, a semiconductor memory apparatus generates an internal voltage which has a voltage level necessary for an internal circuit, by using an external voltage. In order to allow the internal circuit to normally perform an operation, the semiconductor memory apparatus is designed such that the internal voltage level is stabilized to a target level within a preset time after the external voltage is initially applied to the semiconductor memory apparatus.

As a semiconductor memory apparatus is highly integrated, a gap between signal lines or power lines decreases, and thus, the parasitic capacitance between the lines increases. Accordingly, even through the internal voltage is generated to the target level in an internal voltage generation circuit of the semiconductor memory apparatus, the internal voltage of the target level is not transferred to the internal circuit due to the parasitic capacitance between the power lines for transferring the internal voltage to the internal circuit, whereby the misoperation of the semiconductor memory apparatus can be caused.

SUMMARY

A semiconductor memory apparatus which can prevent misoperation of an internal circuit in an initial operation of a to semiconductor memory apparatus is described herein.

In one embodiment of the present invention, a semiconductor memory apparatus includes: a counting control circuit configured to generate a first counting start signal, a second counting start signal and a counting count signal in response to an auto-refresh signal, a voltage stabilization signal and a fuse control signal; and an address counting circuit for auto-refresh configured to count a plurality of count addresses in response to the first counting start signal, and count only specified count addresses among the plurality of count addresses in response to the second counting start signal and the counting control signal.

In another embodiment of the present invention, a semiconductor memory apparatus includes: an address counting circuit for auto-refresh configured to provide a plurality of count addresses which are counted in an auto-refresh operation; and a counting control circuit configured to control the address counting circuit for auto-refresh such that only specified upper bit count addresses among the plurality of count addresses are counted when activating the semiconductor memory apparatus.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to an embodiment of the present invention will be described below with reference to the accompanying drawings through an example embodiment.

Figure 1:
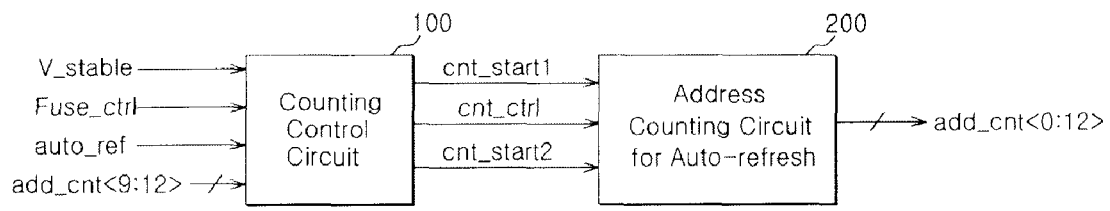
FIG. 1 is a configurational view schematically illustrating a semiconductor memory apparatus in accordance with an embodiment of the present invention.

Referring to FIG. 1, a semiconductor memory apparatus in accordance with an embodiment of the present invention includes a counting control circuit 100 and an address counting circuit 200 for auto-refresh.

The counting control circuit 100 is configured to generate first and second counting start signals cnt_start1 and cnt_start2, respectively, and a count control signal cnt_ctrl in response to an auto-refresh signal auto_ref, a voltage stabilization signal V_stable, a fuse control signal Fuse_ctrl, and specified count addresses (for example, tenth through thirteenth count addresses add_cnt<9:12>) of first through thirteenth count addresses add_cnt<0:12>.

For example, the counting control circuit 100 enables the counting control signal cnt_ctrl when both the voltage stabilization signal V_stable and the fuse control signal Fuse_ctrl are enabled, and enables the second counting start signal cnt_start2 when a preset time elapses after the counting control signal cnt_ctrl is enabled. Also, the counting control circuit 100 enables the first counting start signal cnt_start1 when the counting control signal cnt_ctrl is disabled and the auto-refresh signal auto_ref is enabled. The counting control circuit 100 disables the counting control signal cnt_ctrl when the counting value of the specified count addresses add_cnt<9:12> reaches a preset value. The fuse control signal Fuse_ctrl is the output signal of a general fuse circuit and is enabled or disabled depending upon fuse cutting. The voltage stabilization signal V_stable is a signal that is enabled when a preselected time elapses after a power-up signal (not shown) is enabled, such as, for example, in the case where an external voltage is applied to a deactivated semiconductor memory apparatus and the semiconductor memory apparatus is converted into an activated state.

The address counting circuit 200 for auto-refresh is configured to count the first through thirteenth count addresses add_cnt<0:12> in response to the first counting start signal cnt_start1 and to count the specified count addresses add_cnt<9:12> among the first through thirteenth count addresses add_cnt<0:12> in response to the second counting start signal cnt_start2 and the counting control signal cnt_ctrl. For example, the address counting circuit 200 for auto-refresh counts the first through thirteenth count addresses add_cnt<0:12> when the first counting start signal cnt_start1 is enabled, and counts the specified count addresses add_cnt<9:12> when both the second counting start signal cnt_start2 and the counting control signal cnt_ctrl are enabled.

Figure 2:
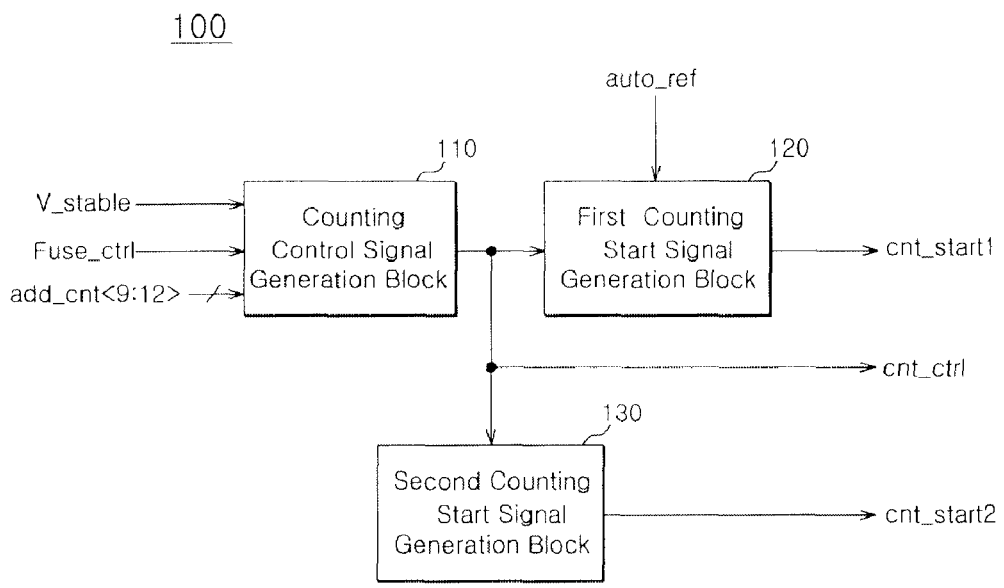
FIG. 2 is a configurational view of the counting control circuit shown in FIG. 1.

Referring to FIG. 2, the counting control circuit 100 includes a counting control signal generation block 110, a first counting start signal generation block 120, and a second counting start signal generation block 130.

The counting control signal generation block 110 is configured to generate the counting control signal cnt_ctrl in response to the voltage stabilization signal V_stable, the fuse control signal Fuse_ctrl and the counting value of the specified count addresses add_cnt<9:12>. For example, the counting control signal generation block 110 enables the counting control signal cnt_ctrl when both the voltage stabilization signal V_stable and the fuse control signal Fuse_ctrl are enabled, and disables the counting control signal cnt_ctrl when the counting value of the specified count addresses add_cnt<9:12> corresponds to the preset value.

The first counting start signal generation block 120 is configured to generate the first counting start signal cnt_start1 in response to the counting control signal cnt_ctrl and the auto-refresh signal auto_ref. For example, the first counting start signal generation block 120 enables the first counting start signal cnt_start1 when the counting control signal cnt_ctrl is disabled and the auto-refresh signal auto_ref is enabled.

The second counting start signal generation block 130 is configured to generate the second counting start signal cnt_start2 in response to the counting control signal cnt_ctrl. For example, the second counting start signal generation block 130 enables the second counting start signal cnt_start2 when the counting control signal cnt_ctrl is enabled and the preset time elapses.

Figure 3:
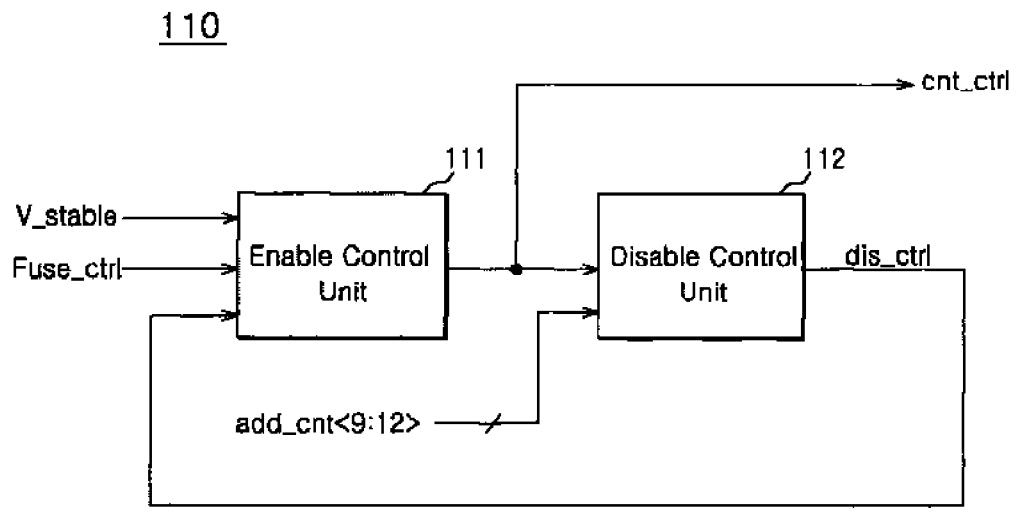
FIG. 3 is a configurational view of the counting control signal generation block shown in FIG. 2.

Referring to FIG. 3, the counting control signal generation block 110 includes an enable control unit 111 and a disable control unit 112.

The enable control unit 111 is configured to enable the counting control signal cnt_ctrl when both the voltage stabilization signal V_stable and the fuse control signal Fuse_ctrl are enabled, and to disable the counting control signal cnt_ctrl when a disable control signal dis_ctrl is enabled.

The disable control unit 112 is configured to enable the disable control signal dis_ctrl when the counting value of the specified count addresses add_cnt<9:12> reaches the preset value. For example, the disable control unit 112 enables the disable control signal dis_ctrl when the counting value of the specified count addresses add_cnt<9:12> reaches '1111' (e.g., a maximum value).

Figure 4:
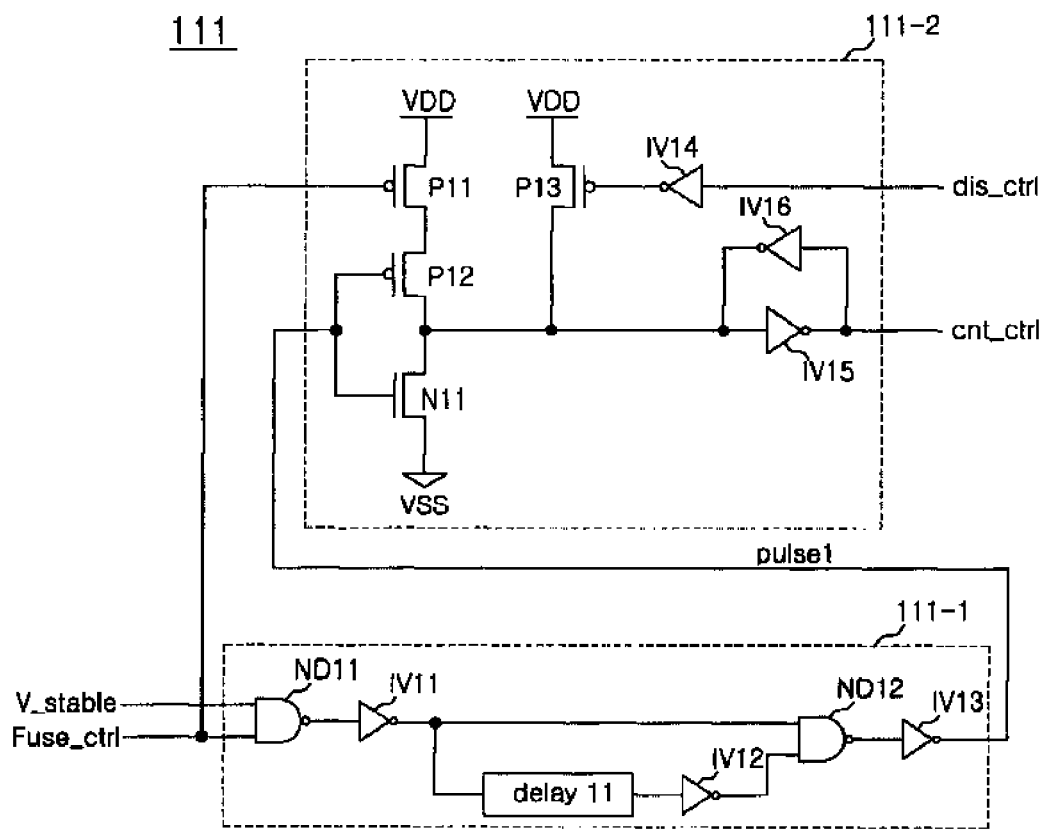
FIG. 4 is a configurational view of the enable control unit shown in FIG. 3.

Referring to FIG. 4, the enable control unit 111 includes a first pulse generation section 111-1 and a signal level maintaining section 111-2.

The first pulse generation section 111-1 is configured to generate a first pulse pulse1 when both the voltage stabilization signal V_stable and the fuse control signal Fuse_ctrl are enabled.

The first pulse generation section 111-1 includes first and second NAND gates ND11 and ND12, respectively; first, second, and third inverters IV11, IV12 and IV13, respectively; and a first delay part delay11. The first NAND gate ND11 receives the voltage stabilization signal V_stable and the fuse control signal Fuse_ctrl. The first inverter IV11 receives the output signal of the first NAND gate ND11. The first delay part delay11 receives the output signal of the first inverter IV11. The second inverter IV12 receives the output signal of the first delay part delay11. The second NAND gate ND12 receives the output signals of the first and second inverters IV11 and IV12. The third inverter IV13 receives the output signal of the second NAND gate ND12 and outputs the first pulse pulse1 based thereon.

The signal level maintaining section 111-2 is configured to enable the counting control signal cnt_ctrl when the first pulse pulse1 is generated and maintain the enabled counting control signal cnt_ctrl until the disable control signal dis_ctrl is enabled.

The signal level maintaining section 111-2 includes first, second, third, and fourth transistors P11, P12, N11, and P13, respectively, and fourth, fifth, and sixth inverters IV14, IV15, and IV16, respectively. The first transistor P11 has a gate which receives the fuse control signal Fuse_ctrl and a source which is applied with an external voltage VDD. The second transistor P12 has a gate which receives the first pulse pulse1 and a source to which the drain of the first transistor P11 is coupled. The third transistor N11 has a gate which receives the first pulse pulse1, a drain to which the drain of the second transistor P12 is coupled, and a source to which a ground terminal VSS is coupled. The fourth inverter IV14 receives the disable control signal dis_ctrl. The fourth transistor P13 has a gate which receives the output signal of the fourth inverter IV14, a source which receives the external voltage VDD, and a drain to which a node where the second transistor P12 and the third transistor N11 are coupled is coupled. The fifth inverter IV15 has an input terminal to which a node where the second through fourth transistors P12, N11 and P13 are coupled is coupled and an output terminal which outputs the counting control signal cnt_ctrl. The sixth inverter IV16 has an input terminal to which the output terminal of the fifth inverter IV15 is coupled and an output terminal which is coupled to the input terminal of the fifth inverter IV15.

Figure 5:
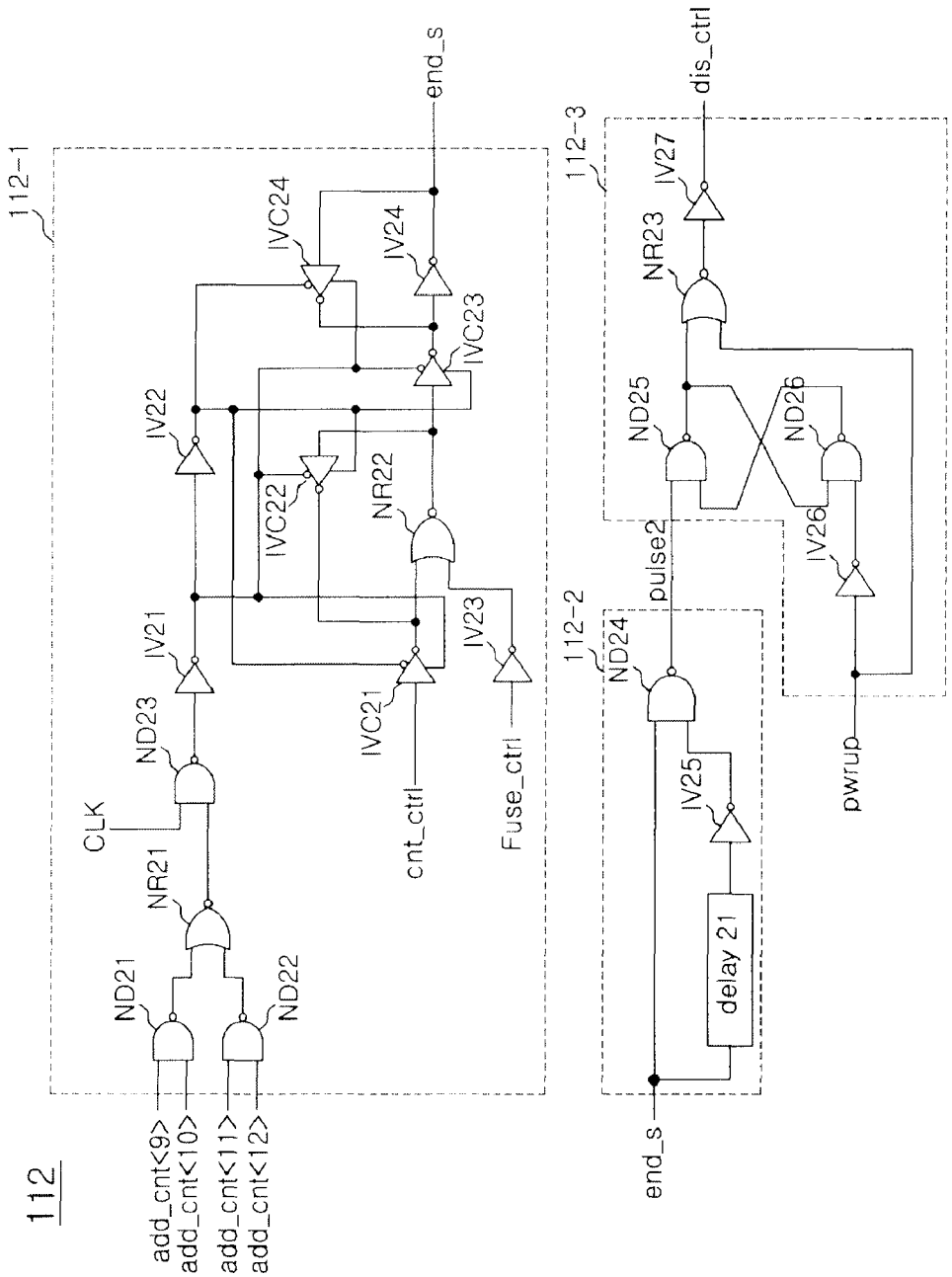
FIG. 5 is a configurational view of the disable control unit shown in FIG. 3.

Referring to FIG. 5, the disable control unit 112 includes an end signal generation section 112-1, a second pulse generation section 112-2, and a latch section 112-3.

The end signal generation section 112-1 is configured to output the counting control signal cnt_ctrl as an end signal ends when the counting value of the specified count addresses add_cnt<9:12> reaches the preset value, such as for example, a maximum value (e.g., '1111').

The end signal generation section 112-1 includes third, fourth, and fifth NAND gates ND21, ND22, and ND23, respectively; first and second NOR gates NR21 and NR22, respectively; seventh, eighth, ninth, and tenth inverters IV21, IV22, IV23, and IV24, respectively; and first, second, third, and fourth control inverters IVC21, IVC22, IVC23, and IVC24, respectively. The third NAND gate ND21 receives the specified count addresses add_cnt<9> and add_cnt<10>. The fourth NAND gate ND22 receives the specified count addresses add_cnt<11> and add_cnt<12>. The first NOR gate NR21 receives the output signals of the third and fourth NAND gates ND21 and ND22. The fifth NAND gate ND23 receives the output signal of the first NOR gate NR21 and a clock CLK. The seventh inverter IV21 receives the output signal of the fifth NAND gate ND23. The eighth inverter IV22 receives the output signal of the seventh inverter IV21. The first control inverter IVC21 has a first control terminal which receives the output signal of the eighth inverter IV22, a second control terminal which receives the output signal of the seventh inverter IV21, and an input terminal which receives the counting control signal cnt_ctrl. The ninth inverter IV23 receives the fuse control signal Fuse_ctrl. The second NOR gate NR22 receives the output signal of the first control inverter IVC21 and the output signal of the ninth inverter IV23. The second control inverter IVC22 has a first control terminal which receives the output signal of the seventh inverter IV21, a second control terminal which receives the output signal of the eighth inverter IV22, an input terminal which receives the output signal of the second NOR gate NR22, and an output terminal to which a node where the first control inverter IVC21 and the second NOR gate NR22 are coupled. The third control inverter IVC23 has a first control terminal which receives the output signal of the seventh inverter IV21, a second control terminal which receives the output signal of the eighth inverter IV22, and an input terminal which receives the output signal of the second NOR gate NR22. The tenth inverter IV24 receives the output signal of the third control inverter IVC23 and outputs the end signal end_s based thereon. The fourth control inverter IVC24 has a first control terminal which receives the output signal of the eighth inverter IV22, a second control terminal which receives the output signal of the seventh inverter IV21, an input terminal which receives the output signal of the tenth inverter IV24, and an output terminal which is coupled to the input terminal of the tenth inverter IV24.

The second pulse generation section 112-2 is configured to generate a second pulse pulse2 when the end signal ends is enabled.

The second pulse generation section 112-2 includes a second delay part delay21, an eleventh inverter IV25, and a sixth NAND gate ND24. The second delay part delay21 receives the end signal end_s. The eleventh inverter IV25 receives the output signal of the second delay part delay21. The sixth NAND gate ND24 receives the end signal end_s and the output signal of the eleventh inverter IV25 and outputs the second pulse pulse2 based thereon.

The latch section 112-3 is configured to enable the disable control signal dis_ctrl in response to the second pulse pulse2 and to maintain the enabled disable control signal dis_ctrl. The latch section 112-3 is initialized when a power-up signal pwrup is enabled and disables the disable control signal dis_ctrl in response thereto.

The latch section 112-3 includes seventh and eighth NAND gates ND25 and ND26, respectively, twelfth and thirteenth inverters IV26 and IV27, respectively, and a third NOR gate NR23. The seventh NAND gate ND25 receives the second pulse pulse2 and the output signal of the eighth NAND gate ND26. The twelfth inverter IV26 receives the power-up signal pwrup. The eighth NAND gate ND26 receives the output signal of the seventh NAND gate ND25 and the output signal of the twelfth inverter IV26. The third NOR gate NR23 receives the output signal of the seventh NAND gate ND25 and the power-up signal pwrup. The thirteenth inverter IV27 receives the output signal of the third NOR gate NR23 and outputs the disable control signal dis_ctrl based thereon.

Figure 6:
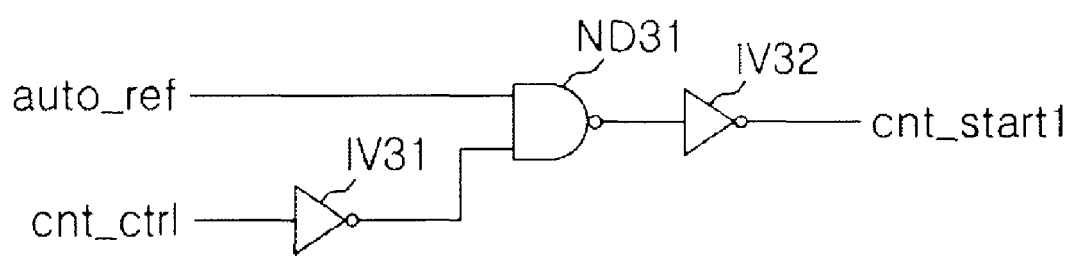
FIG. 6 is a configurational view of the first counting start signal generation block shown in FIG. 2.

Referring to FIG. 6, the first counting start signal generation block 120 includes fourteenth and fifteenth inverters IV31 and IV32, respectively, and a ninth NAND gate ND31. The fourteenth inverter IV31 receives the counting control signal cnt_ctrl. The ninth NAND gate ND31 receives the auto-refresh signal auto_ref and the output signal of the fourteenth inverter IV31. The fifteenth inverter IV32 receives the output signal of the ninth NAND gate ND31 and outputs the first counting start signal cnt_start1 based thereon.

Figure 7:
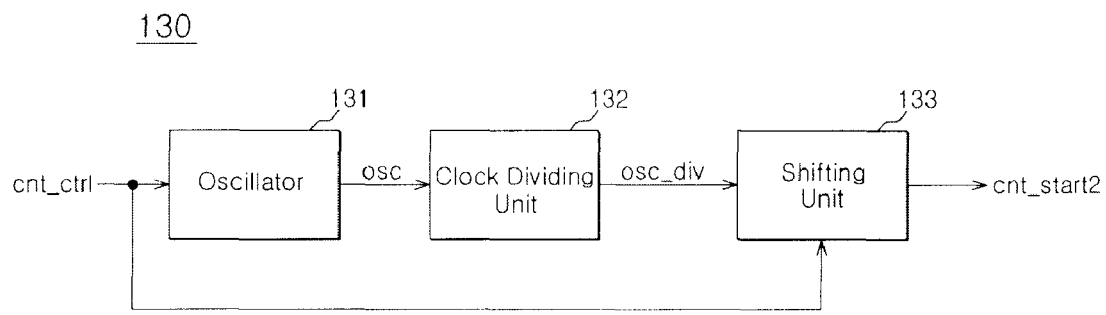
FIG. 7 is a configurational view of the second counting start signal generation block shown in FIG. 2.

Referring to FIG. 7, the second counting start signal generation block 130 includes an oscillator 131, a clock dividing unit 132, and a shifting unit 133.

The oscillator 131 is configured to generate an oscillator signal osc when the counting control signal cnt_ctrl is enabled.

The clock dividing unit 132 is configured to divide the oscillator signal osc and to generate a divided oscillator signal osc_div based thereon.

The shifting unit 133 is configured to shift the counting control signal cnt_ctrl by the cycle of the divided oscillator signal osc_div that corresponds to the preset time (i.e., the time from after the counting control signal cnt_ctrl is enabled to when the second counting start signal cnt_start2 is enabled) and to generate the second counting start signal cnt_start2 based thereon.

Figure 8:
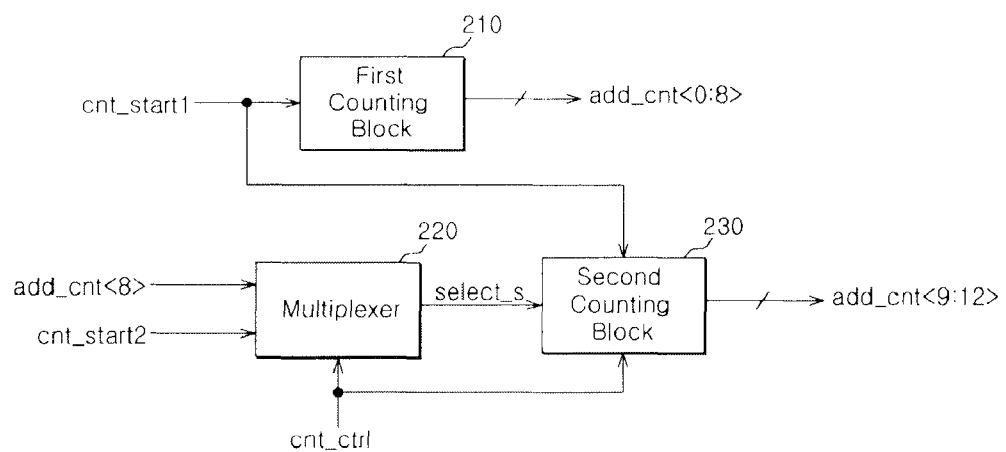
FIG. 8 is a configurational view of the address counting circuit for auto-refresh shown in FIG. 1.

Referring to FIG. 8, the address counting circuit 200 for auto-refresh shown in FIG. 1 includes a first counting block 210, a multiplexer 220, and a second counting block 230.

The first counting block 210 is configured to count the first through ninth count addresses add_cnt<0:8> excluding the specified count addresses (i.e., the tenth through thirteenth count addresses add_cnt<9:12> of the first through thirteenth count addresses add_cnt<0:12>), when the first counting start signal cnt_start1 is enabled.

The multiplexer 220 is configured to output the most significant bit count address (e.g., the ninth count address add_cnt<8> of the first through ninth count addresses add_cnt<0:8>) or the second counting start signal cnt_start2 as a select signal select_s in response to the counting control signal cnt_ctrl. For example, the multiplexer 220 outputs the second counting start signal cnt_start2 as the select signal select_s when the counting control signal cnt_ctrl is enabled, and outputs the ninth count address add_cnt<8> as the select signal select_s when the counting control signal cnt_ctrl is disabled.

The second counting block 230 is configured to count the specified count addresses (i.e., the tenth through thirteenth count addresses add_cnt<9:12>) in response to the select signal select_s.

Figure 9:
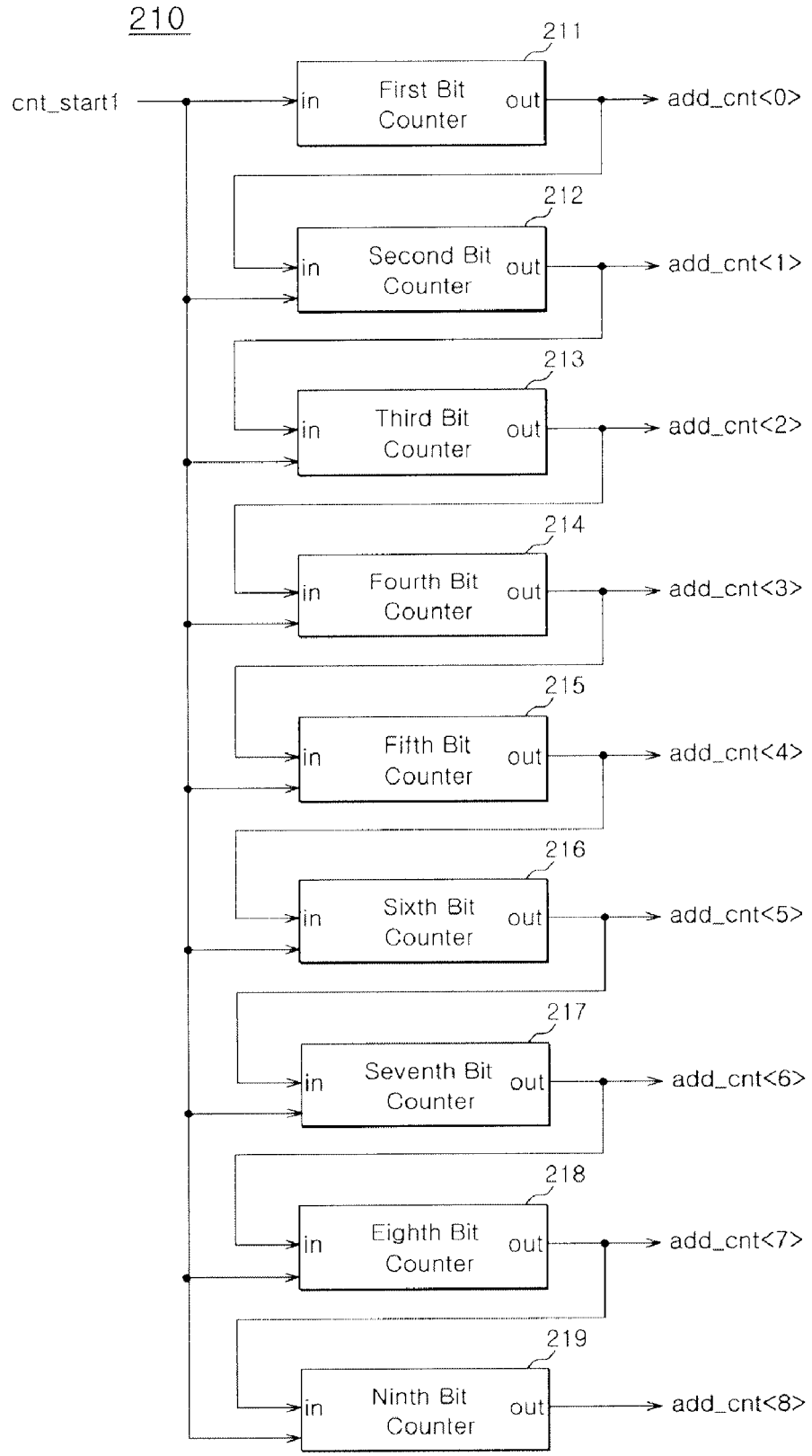
FIG. 9 is a configurational view of the first counting block shown in FIG. 8.

Referring to FIG. 9, the first counting block 210 includes first, second, third, fourth, fifth, sixth, seventh, eighth, and ninth bit counters 211, 212, 213, 214, 215, 216, 217, 218, and 219, respectively, which are coupled in series as shown. The first through ninth bit counters 211, 212, 213, 214, 215, 216, 217, 218, 219 output the first through ninth count addresses add_cnt<0:8>, respectively. The first counting block 210 up-counts the first through ninth count addresses add_cnt<0:8> when the first counting start signal cnt_start1 is enabled. The first through ninth bit counters 211, 212, 213, 214, 215, 216, 217, 217, 219 are activated according to the first counting start signal cnt_start1.

Figure 10:
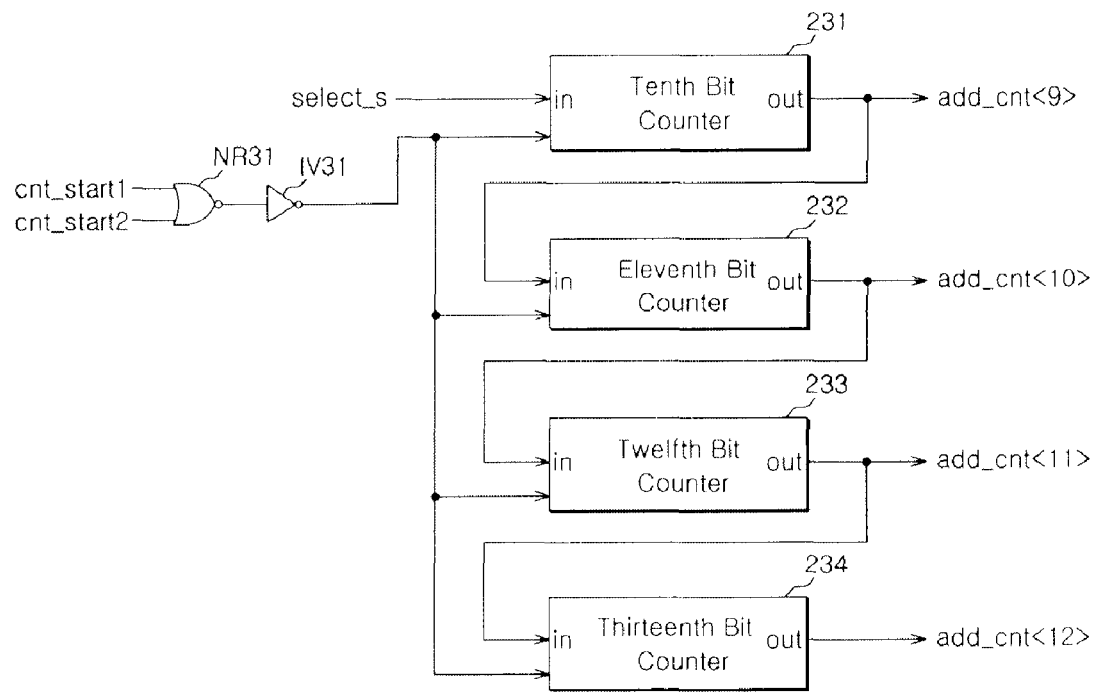
FIG. 10 is a configurational view of the second counting block shown in FIG. 8.

Referring to FIG. 10, the second counting block 230 includes tenth, eleventh, twelfth, and thirteenth bit counters 231, 232, 233, and 234, respectively, which are coupled in series as shown. The tenth through thirteenth bit counters 231, 232, 233, 234 output the tenth through thirteenth count addresses add_cnt<9:12>, respectively. The second counting block 230 up-counts the tenth through thirteenth count addresses add_cnt<9:12> when the select signal select_s is enabled. The tenth through thirteenth bit counters 231, 232, 233, 234, which constitute the second counting block 230, are configured to be activated when any one of the first and second counting start signals cnt_start1 and cnt_start2 are enabled. The second counting block 230 further includes a fourth NOR gate NR31 and a fourteenth inverter IV31. The fourth NOR gate NR31 receives the first and second counting start signals cnt_start1 and cnt_start2. The fourteenth inverter IV31 receives the output signal of the fourth NOR gate NR31 and provides its output to the tenth through thirteenth bit counters 231 through 234.

The semiconductor memory apparatus in accordance with an embodiment of the present invention, configured as mentioned above, operates as described below.

The deactivated semiconductor memory apparatus is activated by being applied with the external voltage VDD, when the fuse control signal Fuse_ctrl is in an enabled state. The counting control signal cnt_ctrl is enabled when the voltage stabilization signal V_stable is enabled. If the preset time elapses after the counting control signal cnt_ctrl is enabled, the second counting start signal cnt_start2 is enabled.

The address counting circuit 200 counts the specified count addresses, that is, the ninth through thirteenth count addresses add_cnt<9:12> of the first through thirteenth count addresses add_cnt<0:12>. The first through eighth count addresses add_cnt<0:8>, which are not counted, maintain an initial value such as '000000000' for example.

The counting control signal cnt_ctrl is disabled when the ninth through thirteenth count addresses add_cnt<9:12> reach the maximum value (e.g., '1111').

If the counting control signal cnt_ctrl is disabled, the second counting start signal cnt_start2 is also disabled, and the ninth through thirteenth count addresses add_cnt<9:12> have an initial value such as '0000' for example.

If the semiconductor memory apparatus is activated and the ninth through thirteenth count addresses add_cnt<9:12> of the first through thirteenth count addresses add_cnt<0:12> are counted, reach the maximum value and then proceed to the initial value, both the counting control signal cnt_ctrl and the second counting start signal cnt_start2 are disabled.

If the counting control signal cnt_ctrl and the second counting start signal cnt_start2 are disabled, the semiconductor memory apparatus generates the first counting start signal cnt_start1 in response to the auto-refresh signal auto_ref.

If the first counting start signal cnt_start1 is enabled, all of the first through thirteenth count addresses add_cnt<0:12> are counted.

In the semiconductor memory apparatus, the tenth through thirteenth count addresses add_cnt<9:12> of the first through thirteenth count addresses add_cnt<0:12> are used as addresses for designating the positions of respective mats which constitute the data storage region of the semiconductor memory apparatus, and the first through ninth count addresses add_cnt<0:8> are used as addresses for designating the positions of the word lines of the respective mats, such that an auto-refresh operation can be performed.

As a result, in the case where a deactivated semiconductor memory apparatus is activated by initially receiving an external voltage, count addresses, which designate respective mats, are sequentially counted, and count addresses, which designate the positions of the word lines of the respective mats, are fixed to initial values, such that only the first word lines of the respective mats can be sequentially enabled. After only the first word lines of the respective mats are sequentially enabled, all count addresses which are used in an auto-refresh operation are counted in response to an auto-refresh signal, whereby the auto-refresh operation can be performed.

In the semiconductor memory apparatus in accordance with an embodiment of the present invention, the respective mats of the semiconductor memory apparatus are activated in the initial operation of the semiconductor memory apparatus, whereby initial misoperation of the semiconductor memory apparatus can be substantially prevented and the operation reliability of the semiconductor memory apparatus can be improved.

While a certain embodiment has been described above, it will be understood to those skilled in the art that the embodiment described is by way of example only. Accordingly, the semiconductor memory apparatus described herein should not be limited based on the described embodiment. Rather, the semiconductor memory apparatus described herein should only be limited in light of the claims that follow when taken in conjunction with the above description and accompanying drawings.

What is claimed is:

1. A semiconductor memory apparatus comprising:
   a counting control circuit configured to generate a first counting start signal, a second counting start signal and a counting count signal in response to an auto-refresh signal, a voltage stabilization signal and a fuse control signal; and
   an address counting circuit for auto-refresh configured to count a plurality of count addresses in response to the first counting start signal, and to count at least one specified count address from among the plurality of count addresses in response to the second counting start signal and the counting control signal.

2. The semiconductor memory apparatus according to claim 1, wherein the counting control circuit enables the counting control signal when both the voltage stabilization signal and the fuse control signal are enabled, and enables the second counting start signal when a preset time elapses after the counting control signal is enabled.

3. The semiconductor memory apparatus according to claim 2, wherein the counting control circuit enables the first counting start signal when the counting control signal is disabled and the auto-refresh signal is enabled.

4. The semiconductor memory apparatus according to claim 2, wherein the counting control circuit disables the counting control signal when a counting value of the specified count addresses reaches a preset value.

5. The semiconductor memory apparatus according to claim 4, wherein the counting control circuit comprises:
   a counting control signal generation block configured to generate the counting control signal in response to the voltage stabilization signal, the fuse control signal, and the counting value of the specified count addresses;
   a first counting start signal generation block configured to generate the first counting start signal in response to the counting control signal and the auto-refresh signal; and
   a second counting start signal generation block configured to generate the second counting start signal in response to the counting control signal.

6. The semiconductor memory apparatus according to claim 5, wherein the first counting start signal generation block enables the first counting start signal when the counting control signal is disabled and the auto-refresh signal is enabled.

7. The semiconductor memory apparatus according to claim 5, wherein the counting control signal generation block comprises:
   an enable control unit configured to enable the counting control signal when both the voltage stabilization signal and the fuse control signal are enabled, and to disable the counting control signal when a disable control signal is enabled; and
   a disable control unit configured to enable the disable control signal when the counting value of the specified count addresses reaches the preset value.

8. The semiconductor memory apparatus according to claim 7, wherein the enable control unit comprises:
   a pulse generation section configured to generate a pulse when both the voltage stabilization signal and the fuse control signal are enabled; and
   a signal level maintaining section configured to enable the counting control signal when the pulse is generated, and to maintain the enabled counting control signal until the disable control signal is enabled.

9. The semiconductor memory apparatus according to claim 7, wherein the disable control unit comprises:
   an end signal generation section configured to output the enabled counting control signal as an end signal when the counting value of the specified count addresses reaches the preset value;
   a pulse generation section configured to generate a pulse when the end signal is enabled; and
   a latch section configured to enable the disable control signal in response to the pulse, and to maintain the enabled disable control signal.

10. The semiconductor memory apparatus according to claim 5, wherein the second counting start signal generation block comprises:
   an oscillator configured to generate an oscillator signal when the counting control signal is enabled;
   a clock dividing unit configured to divide the oscillator signal and to generate a divided oscillator signal; and
   a shifting unit configured to shift the enabled counting control signal by a cycle of the divided oscillator signal that corresponds to the preset time, and to generate the second counting start signal based thereon.

11. The semiconductor memory apparatus according to claim 1, wherein the address counting circuit for auto-refresh comprises:
   a first counting block configured to count the plurality of count addresses excluding the at least one specified count address when the first counting start signal is enabled;
   a multiplexer configured to output a select signal in response to the counting control signal, wherein the select signal corresponds to one of: a most significant bit count address of the plurality of count addresses excluding the specified count addresses and the second counting start signal; and
   a second counting block configured to count the at least one specified count address in response to the select signal.

12. The semiconductor memory apparatus according to claim 11, wherein the first counting block comprises a plurality of bit counters operatively coupled in series, wherein each output of the plurality of bit counters are an output of the first counting block.

13. The semiconductor memory apparatus according to claim 12, wherein the most significant bit address of the plurality of count addresses excluding the at least one specified count address is the output of a final bit counter of the plurality of bit counters.

14. The semiconductor memory apparatus according to claim 11, wherein the second counting block comprises a plurality of bit counters operatively coupled in series, wherein each output of the plurality of bit counters are an output of the second counting block.

15. A semiconductor memory apparatus comprising:
   an address counting circuit for auto-refresh configured to provide a plurality of count addresses which are counted in an auto-refresh operation; and
   a counting control circuit configured to control the address counting circuit for auto-refresh to count at least one specified bit count address from among the plurality of count addresses, and not to count remained count addresses when activating the semiconductor memory apparatus.

16. The semiconductor memory apparatus according to claim 15, wherein the counting control circuit controls the address counting circuit for auto-refresh to count the at least one specified bit count address in response to a voltage stabilization signal which is enabled when the semiconductor memory apparatus is activated and to count the plurality of count addresses in response to an auto-refresh signal.

17. The semiconductor memory apparatus according to claim 16, wherein the counting control circuit comprises:
   a counting control signal generation block configured to enable a counting control signal when the voltage stabilization signal is enabled, and to disable the counting control signal when a counting value of the at least one specified bit count address is at a preset value;
   a first counting start signal generation block configured to generate a first counting start signal when the counting control signal is disabled and the auto-refresh signal is enabled; and
   a second counting start signal generation block configured to enable a second counting start signal when the counting control signal is enabled.

18. The semiconductor memory apparatus according to claim 17, wherein the address counting circuit for auto-refresh comprises:
   a first counting block configured to count the plurality of count addresses excluding the at least one specified bit count address in response to the first counting start signal;
   a multiplexer configured to output a select signal, in response to the counting control signal, wherein the select signal corresponds to one of: a most significant bit of the plurality of count addresses excluding the at least one specified bit count address and the second counting start signal; and
   a second counting block configured to count the at least one specified bit count address in response to the select signal.

19. The semiconductor memory apparatus according to claim 15, wherein the remained count addresses maintain an initial value.

* * * * *